United States Patent
Shirasaki et al.

(10) Patent No.: US 9,991,088 B2
(45) Date of Patent: Jun. 5, 2018

(54) CHARGED PARTICLE BEAM DEVICE AND ABERRATION CORRECTOR

(71) Applicant: Hitachi, Ltd., Chiyoda-ku, Tokyo (JP)

(72) Inventors: Yasuhiro Shirasaki, Tokyo (JP); Momoyo Enyama, Tokyo (JP); Hiroya Ohta, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days. days.

(21) Appl. No.: 15/550,182

(22) PCT Filed: Feb. 18, 2015

(86) PCT No.: PCT/JP2015/054473
§ 371 (c)(1),
(2) Date: Aug. 10, 2017

(87) PCT Pub. No.: WO2016/132487
PCT Pub. Date: Aug. 25, 2016

(65) Prior Publication Data
US 2018/0025886 A1    Jan. 25, 2018

(51) Int. Cl.
*H01J 37/153* (2006.01)
*H01J 37/145* (2006.01)
*H01J 37/14* (2006.01)

(52) U.S. Cl.
CPC ............ *H01J 37/153* (2013.01); *H01J 37/14* (2013.01); *H01J 37/145* (2013.01)

(58) Field of Classification Search
USPC ............................................ 250/396 R, 310
See application file for complete search history.

(56) References Cited

U.S. PATENT DOCUMENTS

| 5,319,207 A | 6/1994 | Rose et al. |
| 8,729,466 B1 * | 5/2014 | Mankos ............... H01J 37/026 250/305 |

(Continued)

FOREIGN PATENT DOCUMENTS

| JP | 62-113350 A | 5/1987 |
| JP | 5-205687 A | 8/1993 |

(Continued)

OTHER PUBLICATIONS

International Search Report (PCT/ISA/210) issued in PCT Application No. PCT/JP2015/054473 dated May 12, 2015 with English translation (4 pages).

(Continued)

*Primary Examiner* — Kiet T Nguyen
(74) *Attorney, Agent, or Firm* — Crowell & Moring LLP

(57) ABSTRACT

An aberration corrector includes a mirror that corrects an aberration of a charged particle beam, a beam separator, and a bypass optical system in the beam separator. The beam separator includes an entrance of the charged particle beam and an exit from which the charged particle beam is emitted to an objective lens, and separates an incident trajectory from the entrance to the mirror and a reflection trajectory from the mirror to the exit from each other by deflecting the charged particle beam in an ON state. The bypass optical system is disposed at a position at which the trajectory of the charged particle beam bypasses when the beam separator is in the ON state, and the trajectory of the charged particle beam passes when the beam separator is in an OFF state, and controls the charged particle beam so that objective lens optical conditions in a trajectory via the mirror and a trajectory passing through the bypass optical system coincide with each other.

12 Claims, 10 Drawing Sheets

(56) References Cited

U.S. PATENT DOCUMENTS

| | | | |
|---|---|---|---|
| 9,406,479 B1* | 8/2016 | Mankos | H01J 37/28 |
| 9,472,373 B1* | 10/2016 | Lanio | H01J 37/28 |
| 2007/0200070 A1 | 8/2007 | Tromp | |
| 2010/0065753 A1* | 3/2010 | Enyama | H01J 37/1472 |
| | | | 250/397 |

FOREIGN PATENT DOCUMENTS

| | | |
|---|---|---|
| JP | 2009-528668 A | 8/2009 |
| JP | 2013-138037 A | 7/2013 |

OTHER PUBLICATIONS

Japanese-language Written Opinion (PCT/ISA/237) issued in PCT Application No. PCT/JP2015/054473 dated May 12, 2015 (3 pages).

* cited by examiner

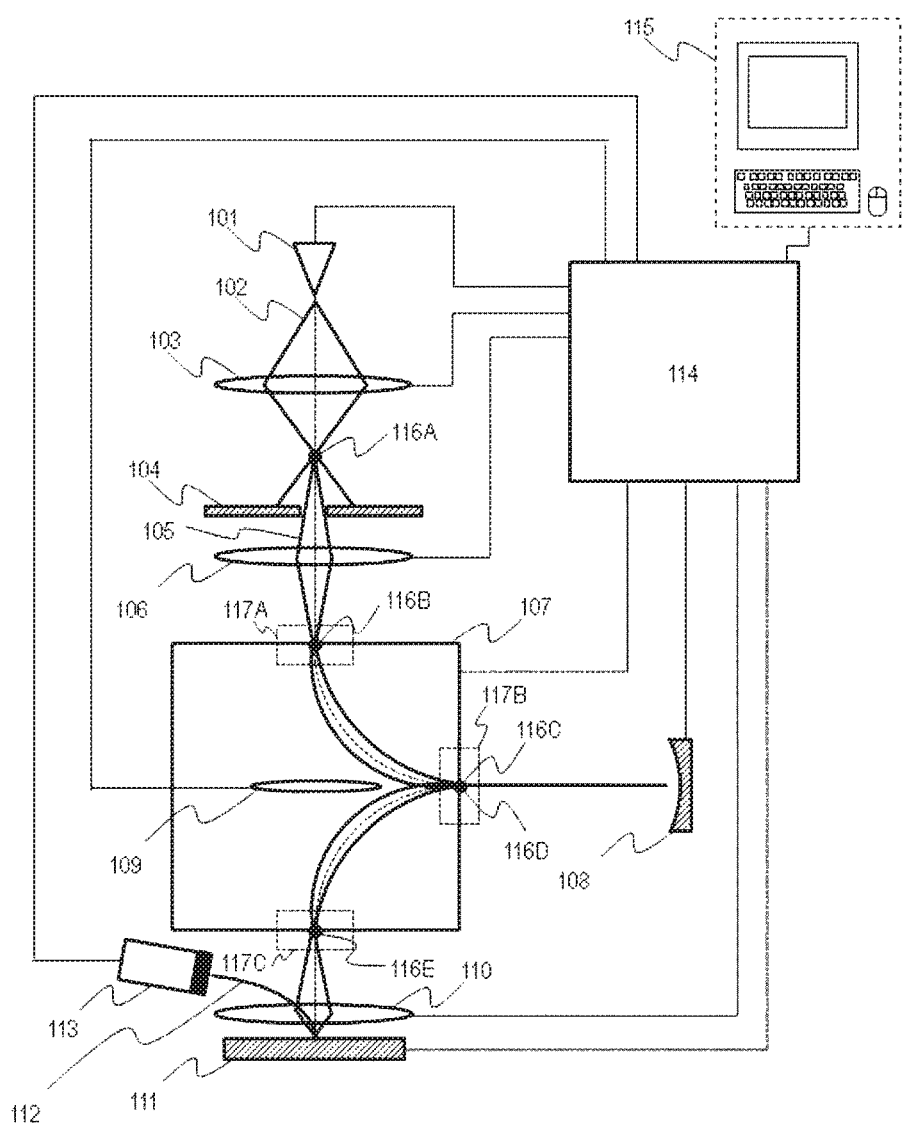
[Fig. 1]

[Fig. 2]
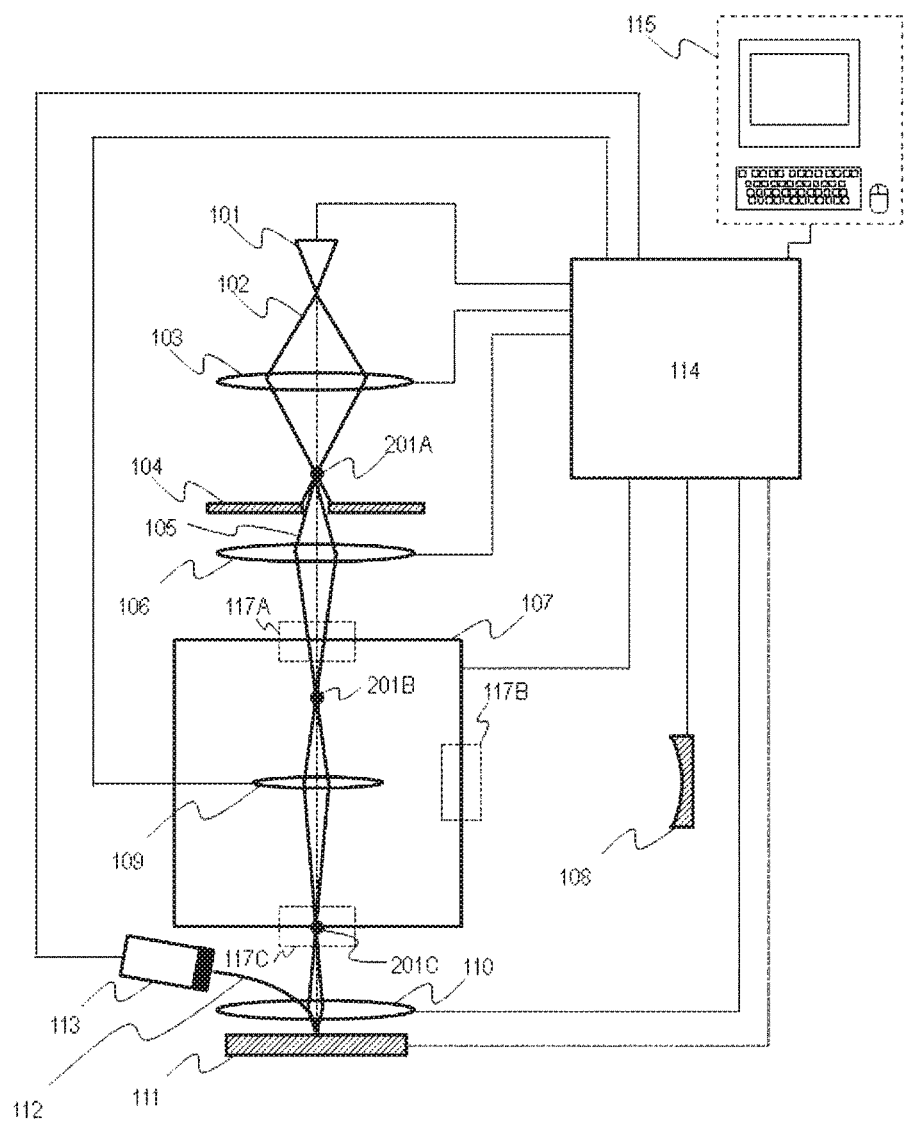

[Fig. 3A] [Fig. 3B]
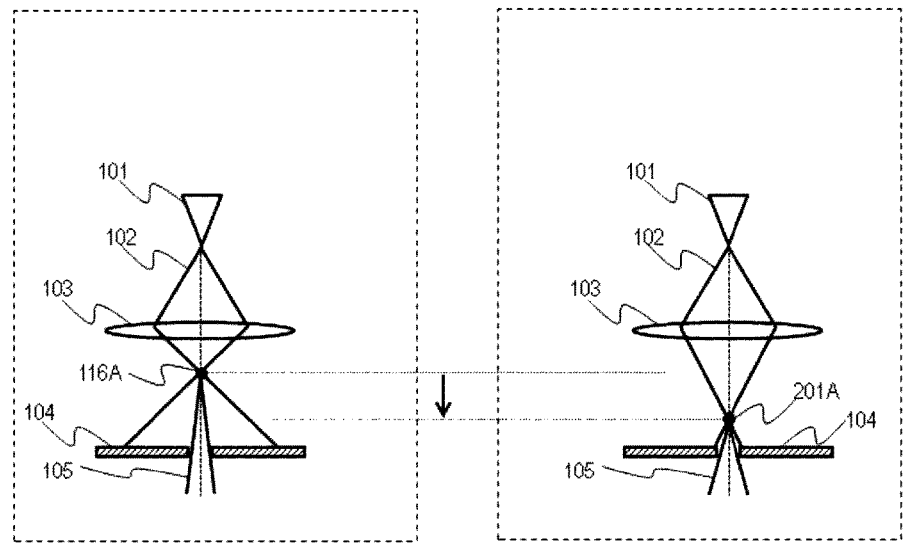
[Fig. 4A] [Fig. 4B] [Fig. 4C]
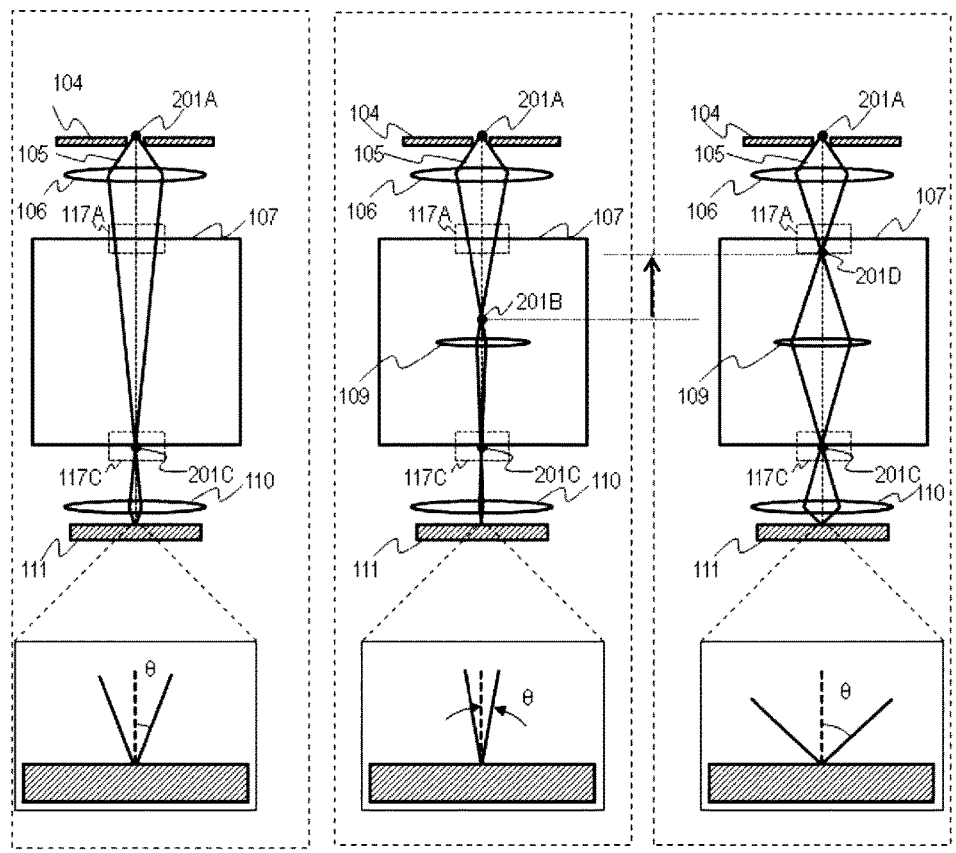

[Fig. 5A]
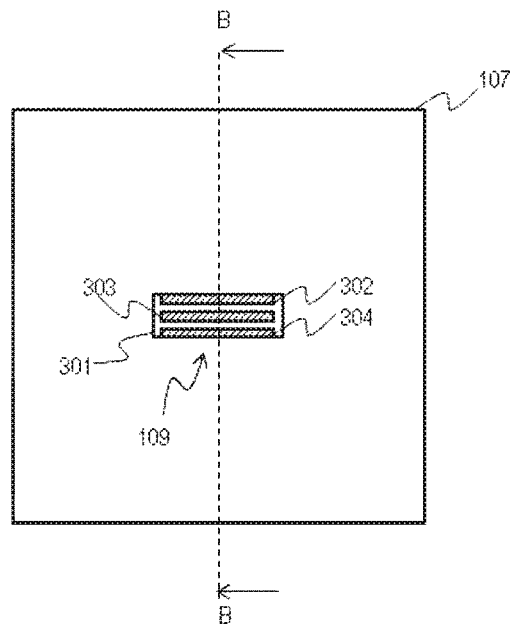
[Fig. 5B]
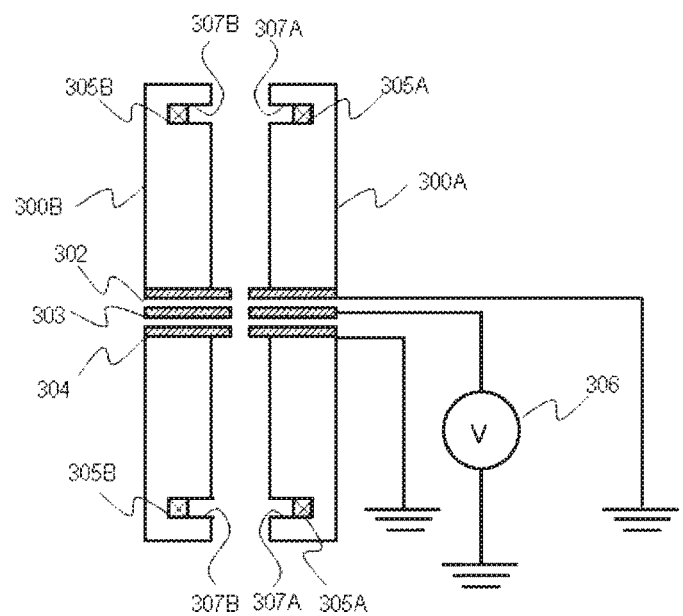

[Fig. 6]
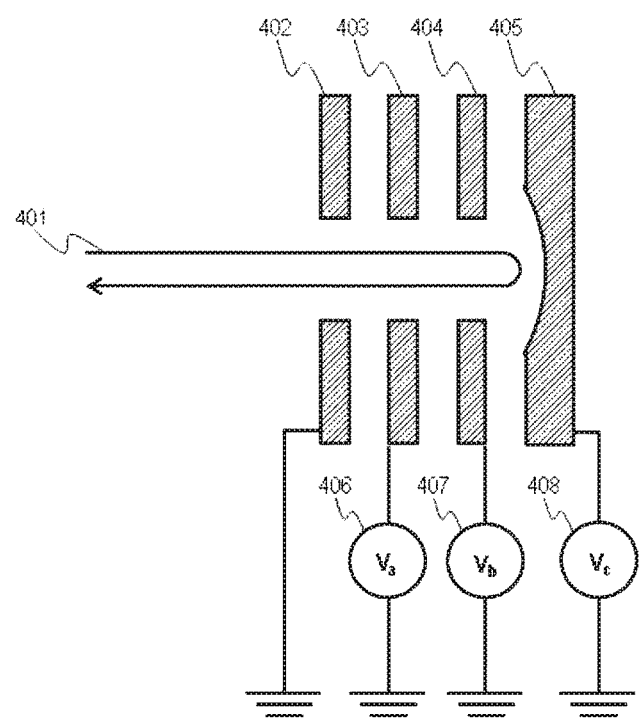

[Fig. 7]
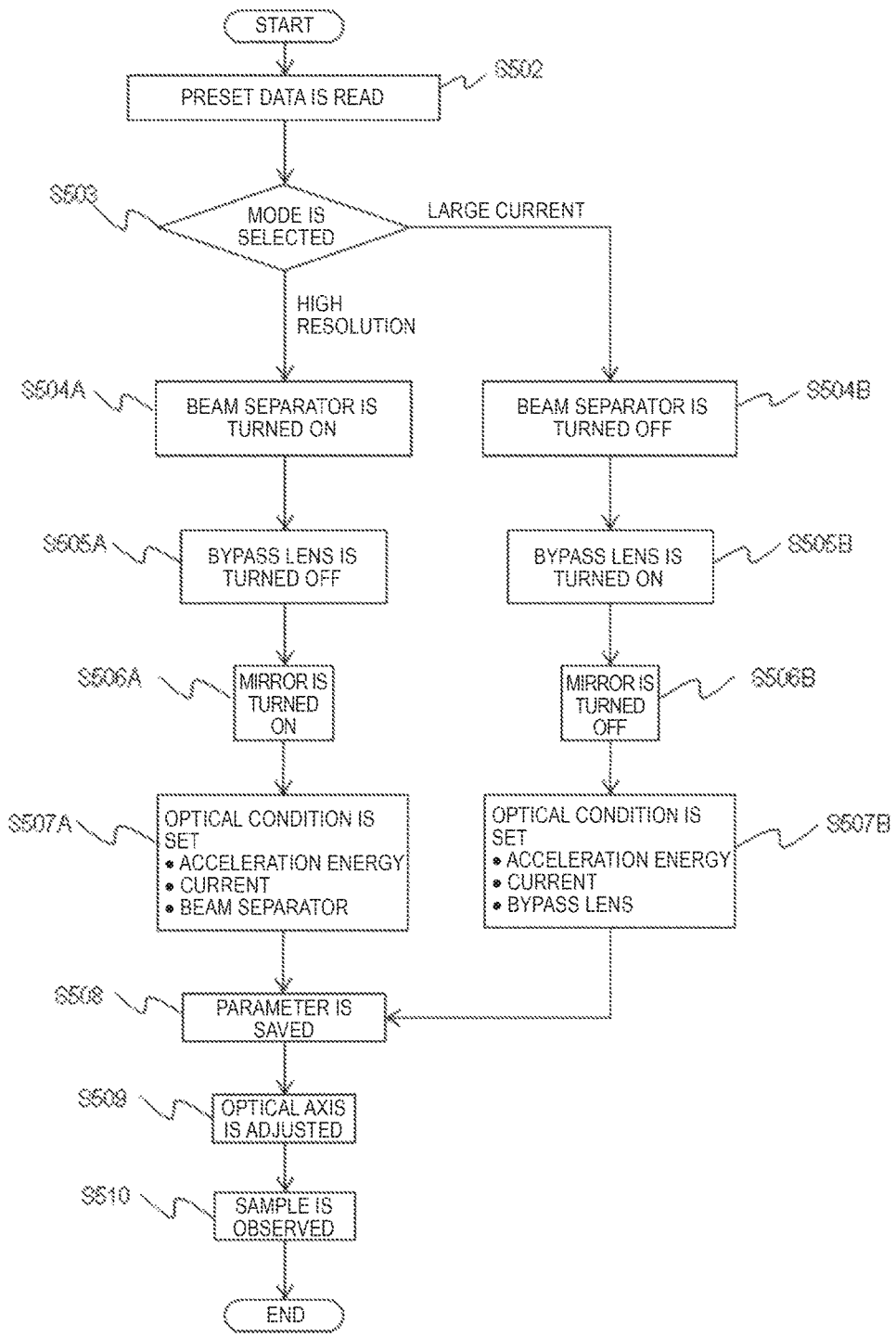

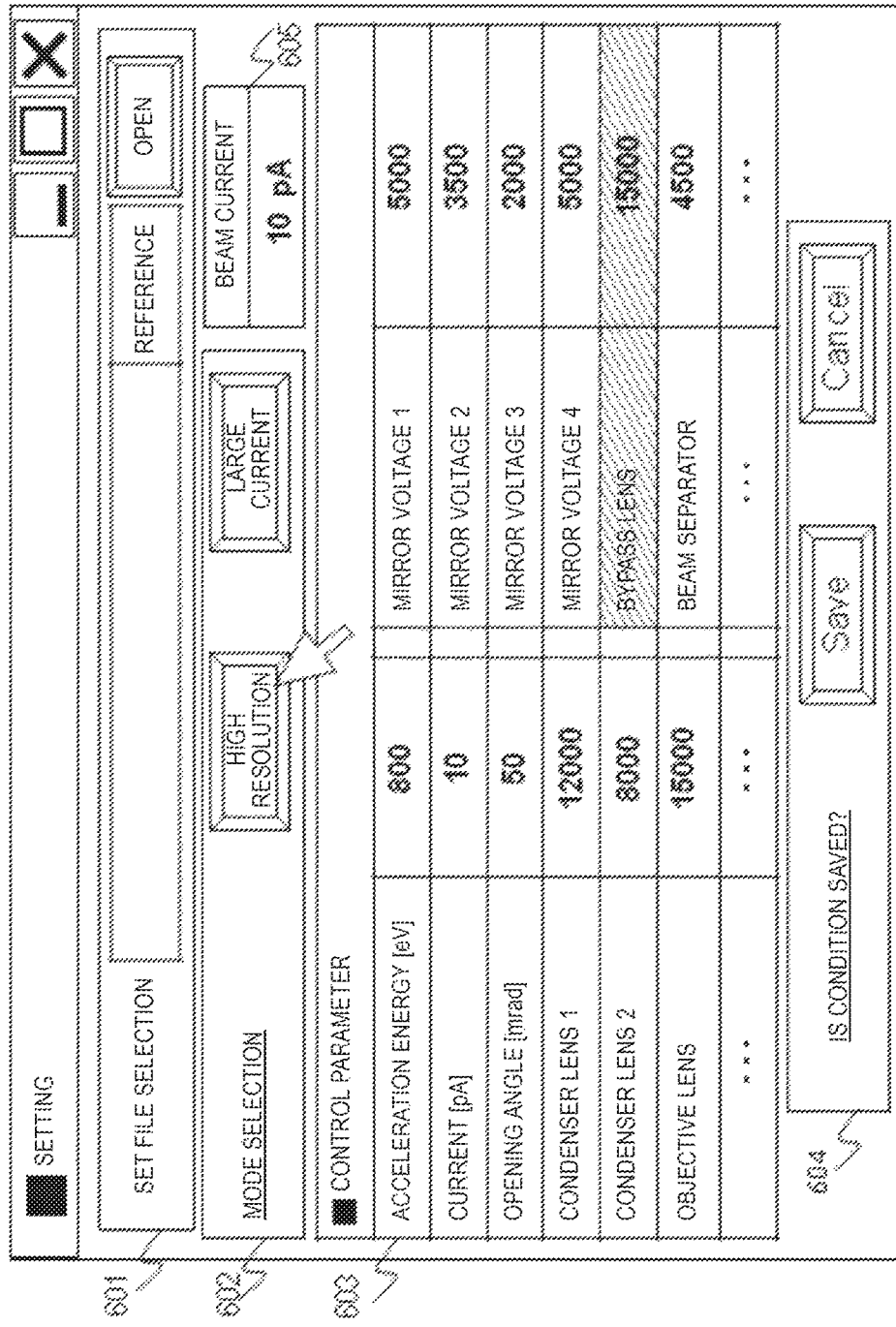
[Fig. 8A]

[Fig. 8B]
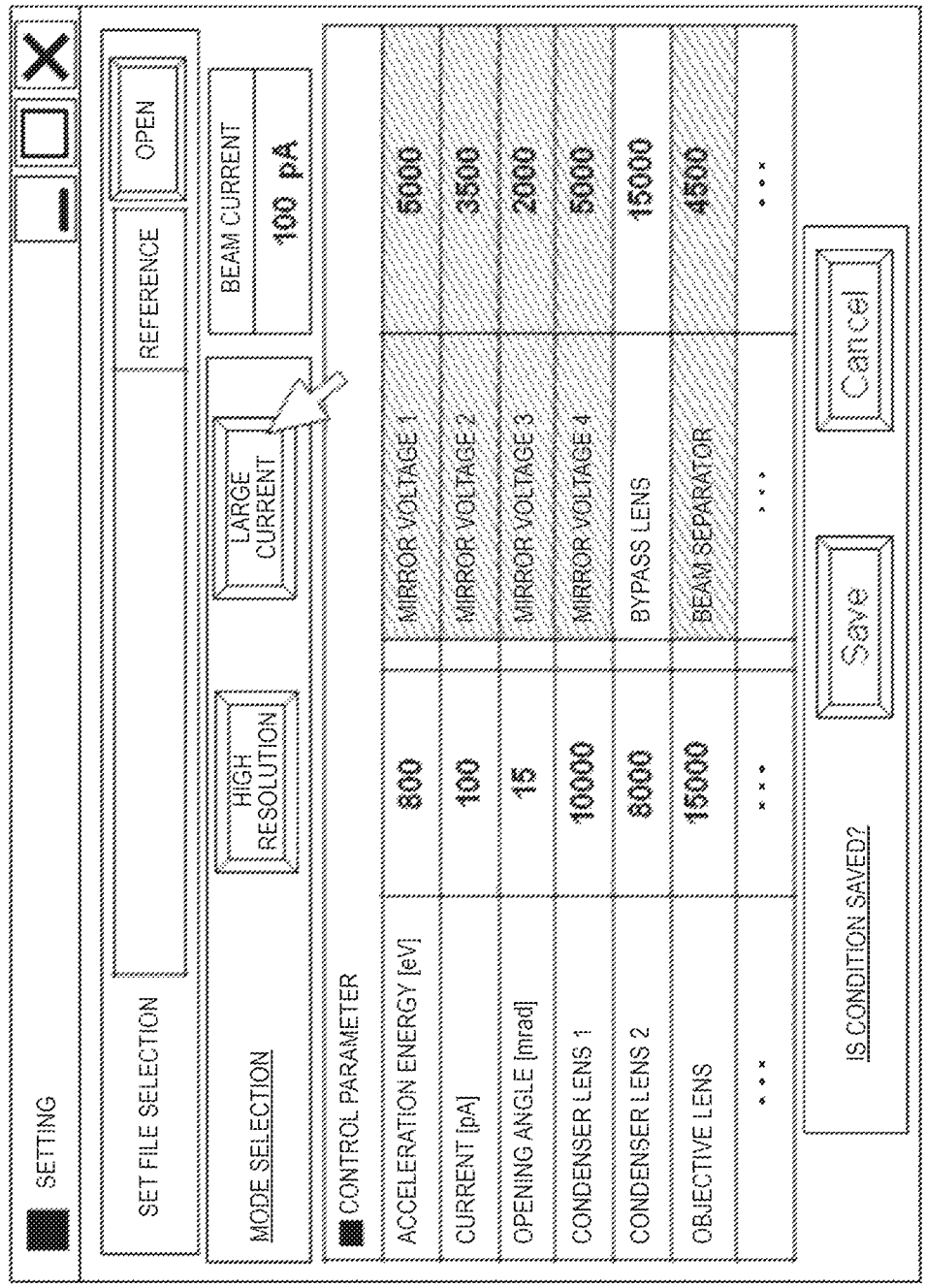

[Fig. 9A]
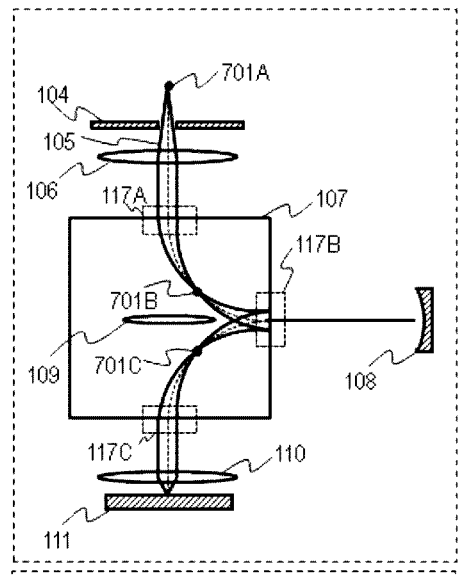
[Fig. 9B]
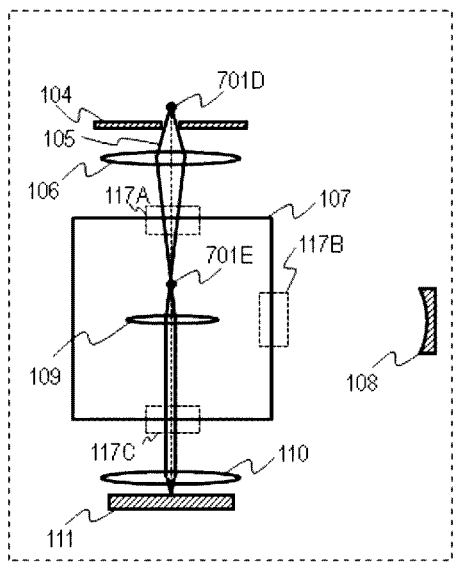
[Fig. 9C]
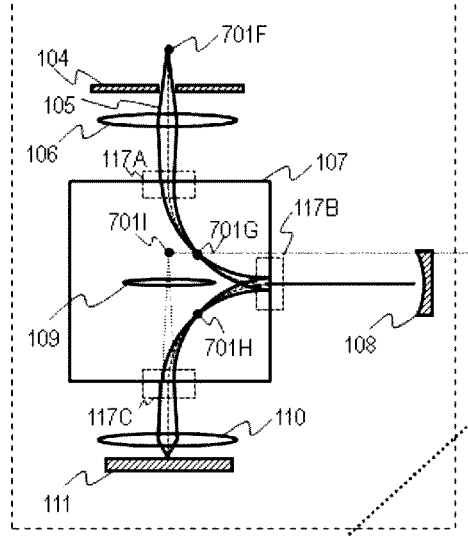
[Fig. 9D]
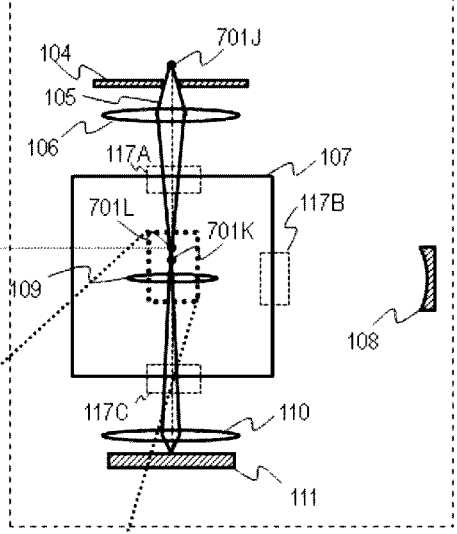
[Fig. 9E]
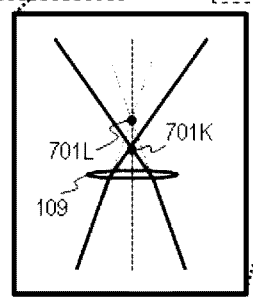

[Fig. 10]
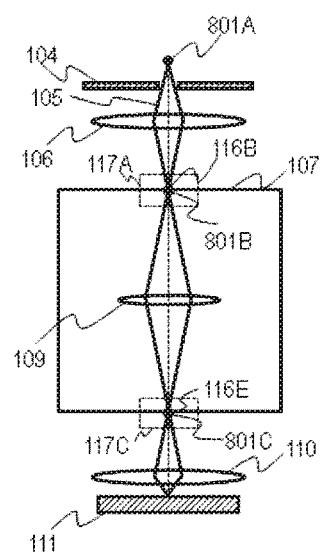

CHARGED PARTICLE BEAM DEVICE AND ABERRATION CORRECTOR

TECHNICAL FIELD

The present invention relates to a charged particle beam application apparatus.

BACKGROUND ART

In a semiconductor manufacturing process, a charged particle beam application apparatus utilizing a charged particle beam such as an electron beam is used for measuring or inspecting of a size or a shape of a semiconductor device. In addition, a general-purpose charged particle beam application apparatus is used to observe an object other than the semiconductor device. An example is a Scanning Electron Microscope (SEM). The SEM irradiates a sample to be observed with the electron beam generated from an electron source, secondary electrons generated by irradiation is detected by a detector, is converted into an electrical signal, and then an image is generated from the electrical signal.

In recent years, miniaturization of the semiconductor device has advanced and high resolution of the SEM is essential. In order to achieve high resolution, it is necessary to reduce a size of the electron beam on a sample surface. Therefore, an aberration corrector for correcting an aberration generated by causing the electron beam to pass through an electromagnetic lens is effective.

JP-T-2009-528668 (PTL 1) discloses a technique that corrects an aberration of the secondary electrons from a sample by an aberration corrector (mirror aberration corrector) using a mirror. PTL 1 discloses the following matters.

"A second magnetic deflector is disposed to receive a first energy dispersive electron diffraction pattern from an electrostatic lens. In addition, the second magnetic deflector is configured to project a second non-dispersive electron diffraction pattern on a first emission surface of the second magnetic deflector. The deflector also has an electronic mirror configured to correct one or a plurality of aberrations. The electronic mirror is disposed so as to reflect the second non-dispersive electron diffraction pattern on the second magnetic deflector to project a second energy dispersive electron diffraction pattern on a second emission surface of the second magnetic deflector." (see abstract).

Moreover, JP-A-62-113350 (PTL 2) discloses a technique that obtains an unfiltered image having the same size as that of an energy filter image by disposing transfer lenses at vertically symmetrical positions of a spectrometer in an electron microscope which includes a plurality of spectrometers for separating an electron beam from a sample according to energy and switches between the energy filter image and the unfiltered image (see claims).

CITATION LIST

Patent Literature

PTL 1: JP-T-2009-528668
PTL 2: JP-A-62-113350

SUMMARY OF INVENTION

Technical Problem

In measurement or inspection of a device, not only high resolution but also high speed is important. In order to achieve the high speed of the measurement and inspection of the device, it is effective to increase a secondary electron signal amount by increasing a beam current of the electron beam. Otherwise, in order to observe regions of different depths of the sample, it is effective to observe the regions with the electron beam at different acceleration voltages.

Therefore, it is desirable that a charged particle beam application apparatus for measurement and inspection of a semiconductor device, or the like can be operated in different modes. For example, it is a mode observed with a large beam current, a mode observed with a small beam current, a mode observed with a high acceleration beam current, and a mode observed with a low acceleration beam current of the electron beam.

As the beam current increases, a Coulomb effect increases. The Coulomb effect is a repulsive force between electrons and is a cause of blur of the electron beam. In addition, the Coulomb effect increases as a flight time of the electron beam becomes longer.

In a case where a mirror aberration corrector is mounted on an apparatus, a length of an optical path of an electron beam trajectory is lengthened and a flight time of the electron beam is lengthened by being decelerated when the electron beam is reflected by the mirror. Therefore, the resolution may be degraded as compared with a case where a mirror aberration correction is not executed. In addition, in a mirror aberration corrector, in order to deflect highly accelerated charged particles to the mirror and appropriately reflect the highly accelerated charged particles by the mirror, a larger operating voltage is required.

Therefore, it is desirable for an apparatus on which the mirror aberration corrector is mounted to be able to select presence/absence of use the mirror aberration corrector. Furthermore, it is desirable that switching of presence/absence of the mirror aberration correction does not change an objective lens optical condition. This is because, if the objective lens optical condition is changed, an operation of the objective lens with respect to secondary electrons changes at the same time so that a condition that the secondary electrons reach a detector changes.

PTL 1 and PTL 2 disclose control of the mirror aberration corrector and the energy filter of a secondary electron beam, but do not disclose control of the mirror aberration corrector for correcting the aberration of the charged particle beam incident on the objective lens and the problem described above concerning the mirror aberration corrector. Therefore, in the charged particle beam application apparatus on which the mirror aberration corrector is mounted, it is desirable that switching of presence/absence of mirror aberration correction can be performed without changing the objective lens optical condition.

Solution to Problem

According to a representative example of the invention, there is provided a charged particle beam application apparatus which irradiates a sample with a charged particle beam generated from a charged particle beam source, the apparatus including a charged particle beam source, an aberration corrector that is disposed downstream the charged particle beam source, an objective lens that is disposed downstream the aberration corrector, and a control unit that controls the aberration corrector. The aberration corrector includes a mirror that corrects aberration of the charged particle beam from the charged particle beam source, a beam separator that includes an entrance on which the charged particle beam from the charged particle beam source is incident and an exit from which the charged particle beam is emitted to the objective lens, and separates an incident trajectory on the mirror from the entrance and a reflection trajectory from the mirror to the exit from each other by deflecting the charged particle beam in an ON state, and a bypass optical system that is disposed at a position at which the trajectory of the charged particle beam bypasses when the beam separator is in the ON state and the trajectory of the charged particle beam passes through when the beam separator is in an OFF state within the beam separator. The bypass optical system controls the charged particle beam so that objective lens optical conditions at the trajectory via the mirror and the trajectory passing through the bypass optical system coincide with each other.

Advantageous Effects of Invention

According to the invention, it is possible to switch presence/absence of the mirror aberration correction without changing the objective lens optical condition.

BRIEF DESCRIPTION OF DRAWINGS

FIG. 1 illustrates a schematic configuration of an electron beam observation apparatus and an electron beam trajectory in a high resolution mode according to Example 1.

FIG. 2 illustrates a schematic configuration of the electron beam observation apparatus and the electron beam trajectory in a large current mode according to Example 1.

FIGS. 3A and 3B illustrate a method for controlling a beam current of an electron beam according to Example 1.

FIGS. 4A-4C illustrate a method for controlling a beam opening angle on a sample according to Example 1.

FIG. 5A illustrates a beam separator and a bypass lens according to Example 1.

FIG. 5B illustrates the beam separator and the bypass lens according to Example 1.

FIG. 6 illustrates a mirror according to Example 1.

FIG. 7 illustrates a flowchart of a mode setting and a sample observation procedure according to Example 1.

FIG. 8A illustrates a mode setting image according to Example 1.

FIG. 8B illustrates a mode setting image according to Example 1.

FIGS. 9A-9E illustrate a method for controlling a trajectory of an electron beam according to Example 2.

FIG. 10 illustrates a method for controlling a trajectory of an electron beam according to Example 3.

DESCRIPTION OF EMBODIMENTS

Hereinafter, examples will be described with reference to the drawings. Moreover, in all the drawings for describing the examples, the same reference numerals are given to same elements and repetitive description thereof is omitted. Hereinafter, the examples of an observation apparatus of a sample using an electron beam will be described, but the effect of the example is not lost in the case of using an ion beam or in other apparatus such as a measuring apparatus and an inspection apparatus.

Example 1

FIG. 1 illustrates a schematic configuration of an electron beam observation apparatus according to Example 1. The electron beam is a charged particle beam and the electron beam observation apparatus is a charged particle beam application apparatus. A first condenser lens 103, a beam current adjusting aperture 104, a second condenser lens 106, a beam separator 107, a mirror 108, and an objective lens 110 are provided on a trajectory of an electron beam 102 derived from an electron source 101.

A bypass optical system is provided in the beam separator 107. The beam separator 107, the mirror 108, and the bypass optical system constitute a mirror aberration corrector. The mirror 108 performs correction of aberration by reflecting the electron beam trajectory. The beam separator 107 performs separation of the trajectory of the electron beam incident on the mirror 108 and the electron beam emitted from the mirror 108.

In the example, the electron source 101 and the second condenser lens 106 upstream, and the objective lens 110 downstream the mirror aberration corrector are disposed on a straight line. The bypass optical system is an optical element that diverges or converges the electron beam, and changes divergence/convergence angle of the electron beam. In the example, the bypass optical system is a one-stage bypass lens 109, but may be a combination of a plurality of lenses. In addition, an aligner, a stigmeter, a scanning deflector (not illustrated), or the like may be added for adjusting an axis of the electron beam. In the present specification, elements which act on the charged particle beam such as an electron source, a lens, an aligner, and a detector, are collectively referred to as optical elements.

In the example, the first condenser lens 103, the second condenser lens 106, and the objective lens 110 are magnetic lenses that control a focal length by an excitation current to a coil and the bypass lens is an electrostatic lens that controls a focal length by a voltage applied to a lens electrode. All the lenses may be the magnetic lens or the electromagnetic lens, or may be a combination thereof. The optical elements are controlled by a system control unit 114. A user can confirm and change setting of each optical element using a user terminal 115.

For example, the system control unit 114 includes a processor that operates according to a control program, a memory that stores control programs and setting data, an interface that controls optical elements of the electron beam observation apparatus, and an interface that communicates with the user terminal 115. The processor communicates with the user terminal 115 to receive instructions and parameters for controlling the electron beam observation apparatus and further controls the optical elements of the electron beam observation apparatus according to the instructions and parameters.

The user terminal 115 has, for example, a typical computer configuration. The user terminal 115 includes an interface for communicating with the processor, the memory, and the system control unit 114, and includes an input device and an output device for the user to operate.

Hereinafter, a method for acquiring an image using the apparatus configuration will be described. The apparatus has a plurality of observation modes. In the example, a high resolution mode and a large current mode among them will be described. The high resolution mode is effective in a case where the observation is performed placing importance on resolution and is a small current mode using an electron beam with a beam current smaller than that in the large current mode. The large current mode is effective in a case where the beam current of the electron beam to be used is increased to observe at high speed.

A method for acquiring an image in the high resolution mode will be described with reference to FIG. 1. The electron beam 102 emitted from the electron source 101 passes through the first condenser lens 103, is converged at a convergence point 116A between the first condenser lens 103 and the aperture 104, and then passes through the aperture 104. When the electron beam 102 passes through the aperture 104, some of the electron beam is blocked and becomes an electron beam 105 with which a sample is irradiated. In this case, a beam current of the electron beam 105 passing through the aperture 104 is able to be controlled by a distance between the convergence point 116A and the aperture 104.

This will be described with reference to FIG. 3. FIG. 3 illustrates an enlarged view of an optical system from the electron source 101 to the aperture 104 in FIG. 1. (A) of FIG. 3 illustrates an example of a case where the beam current is small and (B) of FIG. 3 illustrates an example of a case where the beam current is large. In (A) of FIG. 3, since the convergence point 116A is far from the aperture 104, most of the beam current of the electron beam 102 is blocked by the aperture 104.

On the other hand, in (B) of FIG. 3, since a convergence point 201A is closer to the aperture 104 than the convergence point 116A, most of the beam current of the electron beam 102 passes through the aperture 104 without being blocked. As described above, the beam current of the electron beam 105 is adjusted. The high resolution mode corresponds to (A) of FIG. 3 and in order to suppress beam blur such as a Coulomb effect, the convergence point 116A is set at a position far from the aperture 104 and thereby the beam current of the electron beam 105 is a small current.

For example, the electron beam 105 of which the beam current is adjusted to 10 pA passes through the aperture 104, passes through the second condenser lens 106, and then is converged at a convergence point 116B at an entrance 117A of the beam separator 107. The system control unit 114 controls the beam separator 107 so that the electron beam 105 is deflected by 90 degrees after being converged. The electron beam 105 is deflected by 90 degrees by the beam separator 107 and is converged again at an entrance/exit 117B of the beam separator 107, and is converged at a convergence point 116C.

Thereafter, the electron beam 105 is reflected on the mirror 108 to correct a spherical aberration and a chromatic aberration, and then passes through the same trajectory in the opposite direction, and is converged again at a convergence point 116D at the entrance/exit 117B of the beam separator 107. Thereafter, the electron beam 105 is incident again on the beam separator 107. Moreover, in FIG. 1, detailed description of the electron beam trajectory between the beam separator 107 and the mirror 108 is omitted.

The electron beam 105 passes through again the beam separator 107, is deflected again by 90 degrees, and is converged again at a convergence point 116E at an exit 117C of the beam separator 107. The convergence point 116E at the exit 117C is positioned on an extension line of a center trajectory of the electron beam 105 before incident on the beam separator 107. The convergence point 116E is an object point of the objective lens 110. The electron beam 105 passes through the beam separator 107 twice, passes through the objective lens 110, and is converged on a sample 111.

As described above, the beam separator 107 separates an incident trajectory from the entrance 117A to the mirror 108 and a reflection trajectory from the mirror 108 to the entrance/exit 117B from each other by deflecting the electron beam in different directions in the incident trajectory and the reflection trajectory due to an influence of an internal magnetic field. The trajectory of the electron beam 105 bypasses a bypass lens 109 in the beam separator 107. The bypass lens 109 is disposed at a position including a midpoint between the entrance 117A and the exit 117C, and the electron beam 105 in the high resolution mode is easy to bypass to make a design of the mirror aberration corrector easier.

The mirror 108 corrects the spherical aberration and the chromatic aberration. Since a beam opening angle is set to be large on the sample 111, a diffraction aberration is also suppressed. Moreover, the mirror 108 may correct only one of the spherical aberration and the chromatic aberration, or, for example, may correct only the chromatic aberration. A beam diameter on the sample 111 is sufficiently small relative to a dimension of the sample to be observed and is, for example, 1 nm. The electron beam 105 with which the sample 111 is irradiated interacts with a substance near a surface, and secondary electrons, reflected electrons, or the like are generated depending on a shape and a material of the sample, and become a signal to be acquired.

Hereinafter, in the example, these electrons are collectively referred to as secondary electrons 112. The secondary electrons 112 are detected by a detector 113. When the electron beam 105 is scanned on the sample 111 using a deflector (not illustrated) for scanning, an amount of a detection signal varies depending on a beam irradiation position. A Scanning Electron Microscope (SEM) image is acquired by imaging the amount with brightness. The acquired SEM image is displayed on the user terminal 115.

As described above, the electron beam 105 passes through the beam separator 107 once, emits from the beam separator 107, is reflected by the mirror 108, passes through the same trajectory in the opposite direction, and is incident again on the beam separator 107. That is, the electron beam 105 passes through the beam separator 107 twice before and after reflection on the mirror 108.

The position at which the electron beam 105 emits from the beam separator 107 when passing through the beam separator for the first time is the same as the position at which the electron beam 105 is incident on the beam separator 107 when passing through the beam separator 107 for the second time. The beam separator 107 separates the trajectory of the electron beam 105 by bending the trajectory of the electron beam 105 in different directions for the first time and the second time from each other due to the influence of the internal magnetic field.

The electron beam 105 passed through the beam separator 107 twice is emitted in a direction of the sample 111. The beam diameter on the sample 111 can be reduced, and the sample 111 can be measured or inspected with high resolution by using the mirror aberration corrector.

Subsequently, a method for acquiring an image in a large current mode will be described. FIG. 2 illustrates an outline of an apparatus configuration of the example and an electron beam trajectory in the large current mode. The apparatus configuration is the same as that illustrated in FIG. 1. Here, only portions different from FIG. 1 will be described in detail.

Even in the large current mode, similar to the high resolution mode described above, the electron beam 102 emitted from the electron source 101 passes through the first condenser lens 103 and is converged at the convergence point 201A, becomes the electron beam 105 of which the amount of the beam current is adjusted by the aperture 104, and the electron beam 105 passes through the second condenser lens 106, and is converged at a convergence point 201B.

In the large current mode, the beam current applied to the sample 111 is increased in order to increase a signal amount reaching the detector 113 as compared with the high resolution mode. As described with reference to FIG. 3, as illustrated in (B) of FIG. 3, the convergence point 201A is set closer to the aperture 104 than the convergence point 116A ((A) of FIG. 3) in the high resolution mode, so that an increase in the beam current can be obtained. The beam current is, for example, 100 pA.

After passing through the second condenser lens 106, the electron beam 105 adjusted to a large current is converged at the convergence point 201B and is incident on the beam separator 107. In the large current mode, it is important to suppress the Coulomb effect. For this reason, the system control unit 114 does not operate the beam separator 107 in the large current mode unlike the high resolution mode. The electron beam 105 passes straight through the beam separator 107 without being deflected. This avoids the influence of the Coulomb effect due to extension of an electron beam optical path length and deceleration of the electron beam by the beam separator 107 and the mirror 108.

The entrance 117A, the bypass lens 109, and the exit 117C are disposed on a straight line. In the large current mode, the electron beam 105 is not deflected by the beam separator 107 but is incident on the bypass lens 109. Since the bypass lens 109 is disposed in the beam separator 107, the length of the electron beam trajectory can be made shorter than that in a configuration in which the bypass lens 109 is disposed upstream or downstream the beam separator.

The electron beam 105 passes through the bypass lens 109, is converged at a convergence point 201C by a lens operation thereof, passes through the objective lens 110, and then is converged on the sample 111. The convergence point 201C is an object point of the objective lens 110. An operation from the irradiation of the sample 111 with the electron beam 105 to the acquisition of the SEM image is the same as that in the high resolution mode.

In order to make optical conditions of the objective lens 110 in the high resolution mode and the large current mode the same, each object point, that is, the convergence point 116E and the convergence point 201C are set to the same position. Since the spherical aberration and the chromatic aberration are not corrected in the large current mode, in order to reduce the beam diameter of the electron beam 105 on the sample 111, it is preferable that the beam opening angle on the sample 111 is reduced so that these aberrations are suppressed.

The effect of the bypass lens 109 in the large current mode, that is, a method for controlling the beam opening angle of the electron beam 105 on the sample 111 using the bypass lens 109 will be described with reference to FIG. 4. FIG. 4 illustrates a view in which the optical system is enlarged from the aperture 104 to the sample 111.

(A) of FIG. 4 illustrates a case where the bypass lens 109 is not mounted. (B) of FIG. 4 illustrates a case where the bypass lens 109 is mounted and the beam opening angle is small on the sample 111. (C) of FIG. 4 illustrates a case where the bypass lens 109 is mounted and the beam opening angle is large on the sample 111. The beam opening angle on the sample 111 is indicated by θ.

In (A) of FIG. 4, the electron beam 105 is converged at the convergence point 201C by the second condenser lens 106 and is converged on the sample 111 through the objective lens 110. The beam opening angle θ on the sample 111 is uniquely determined and cannot be controlled. In order to solve the problem, the bypass lens 109 is introduced. The control of the beam opening angle on the sample 111 by the bypass lens 109 will be described with reference to (B) and (C) of FIG. 4.

The optical systems of (B) and (C) of FIG. 4 have the same configuration and the electron beam 105 is converged by the second condenser lens 106 in front of the bypass lens 109 in both cases. The convergence points are indicated by the convergence point 201B in (B) of FIG. 4 and indicated by a convergence point 201D in (C) of FIG. 4. Thereafter, the electron beam 105 is converged at the convergence point 201C by the bypass lens 109 and is converged on the sample 111 by the objective lens 110.

In (B) of FIG. 4, the convergence point 201B is at a position closer to the bypass lens 109 than the convergence point 201D in (C) of FIG. 4. As a result, the beam opening angle θ on the sample 111 can be reduced.

As described above, if the position of the convergence point between the second condenser lens 106 and the bypass lens 109 is controlled by the second condenser lens 106, it is possible to control the beam opening angle θ on the sample 111 without changing the optical conditions of the objective lens 110. The resolution in the large current mode can be improved by using the bypass lens 109 to reduce the beam opening angle θ more than that in a configuration without including the bypass lens 109. For example, the bypass lens 109 can reduce a value of the resolution in the large current mode from 4 nm to 3 nm.

Moreover, in the example, in the high resolution mode, the bypass lens 109 is set to be in the OFF state and in the large current mode, the mirror 108 is set to be in the OFF state. In a case where they do not affect the trajectory of the electron beam 105, they may be set to be in the ON state and it is not always necessary to be turned off in the large current mode as long as it is within the scope of the invention. These controls are performed by the system control unit 114 when switching the observation mode.

In addition, the configuration described above exemplifies the optical conditions of the objective lens 110 as the objective lens optical conditions. The objective lens optical conditions are not limited to the examples described above. A retarding voltage and a boosting voltage for controlling the acceleration of the charged particle beam are also examples of the objective lens optical conditions. It is possible to change the position of the convergence point by changing them. That is, the objective lens optical conditions can also be said to be a driving voltage or current of the optical element downstream the beam separator.

In addition, the "objective lens optical conditions are not changed" can also be said that the object point of the objective lens in the trajectory via the mirror and the object point of the objective lens in the trajectory passing through the bypass optical system coincide with each other, or the magnifications of acquired images coincide with each other. In this case, the expressions "not changed" and "coincide" need only coincide within a certain range so as to be within the scope of the problem to be solved by the invention and do not need to be interpreted as strictly coincide.

In the example, in order to change the amount of the beam current, the optical conditions of the first condenser lens 103 and the second condenser lens 106 are changed, and the beam current of the electron beam 105 through the aperture 104 is adjusted. Alternatively, the beam current may be adjusted, for example, by changing the position or the opening diameter of the aperture 104 on the optical axis without changing the optical conditions. In addition, in the example, the convergence point 201A is positioned upstream the aperture 104, however, even if it is positioned downstream the aperture 104, the beam current can be adjusted by the same method as the method illustrated in the example.

In addition, in the example of the high resolution mode, as illustrated in FIG. 1, the electron beam 105 is converged only at the entrance 117A, the entrance/exit 117B, and the exit 117C of the beam separator 107. The system control unit 114 may control the optical element so that the electron beam 105 is also converged in the beam separator 107. The trajectory or a position of an imaging point of the electron beam 105 in the beam separator 107 does not affect the configuration or effect of the bypass lens 109.

Configurations of the beam separator 107 and the bypass lens 109 in the example will be described with reference to FIGS. 5A and 5B. FIG. 5A illustrates a front view of the beam separator 107 which is viewed from a front side of a paper surface of FIG. 2. FIG. 5B illustrates a sectional view that is taken by cutting line BB of the front view of FIG. 5A.

The beam separator 107 in the example includes two magnetic material plates 300A and 300B disposed in parallel to face each other. As illustrated in FIG. 5A, the beam separator 107 has an opening 301. Three non-magnetic electrodes 302, 303, and 304 are disposed in the opening 301. As illustrated in the sectional view of FIG. 5B, the electrodes 302, 303, and 304 have concentric openings through which the electron beam 105 passes.

An insulator is inserted between the electrodes 302, 303, and 304, or a vacuum is therebetween. In the example, the bypass lens 109 is an Einzel lens, the outer electrode 302 and electrode 304 are grounded, and a lens voltage is applied from a voltage source 306 to the center electrode 303.

Even if the electrode 302 and the electrode 304 are directly attached to the beam separator 107 to establish electrical conduction with the magnetic material plates 300A and 300B, and the beam separator 107 is grounded, the same effect can be obtained. Moreover, in a case where a voltage is applied without grounding a lens barrel to accelerate the electron beam, similarly, a voltage is applied to the electrode 302 and the electrode 304 without grounding.

Grooves 307A and 307B are respectively formed inside of the magnetic material plates 300A and 300B. The grooves 307A and 300B formed on facing surfaces of the magnetic material plates 300A and 300B are respectively single loop-like grooves. Coils 305A and 305B for generating a magnetic field for deflecting the electron beam 105 by 90 degrees are respectively embedded in the grooves 307A and 307B. The coils 305A and 305B are respectively single loop-like coils.

The system control unit 114 causes an excitation current to flow through the coils 305A and 305B only in the high resolution mode, and the beam separator 107 to be turned on. In a case where ON/OFF switching of the beam separator 107 is performed, the excitation current of the coils 305A and 305B is changed at the time of switching, and then magnetic field generated by the beam separator 107 may not be reproduced even if it is returned to an original value.

This is due to the influence of a magnetic history generated in a magnetic material of the beam separator 107. The control of the optical element for suppressing the influence of the magnetic history is called degauss. For example, the degauss is set to a desired excitation current after an excitation current of an opposite signal is applied to the coils 305A and 305B when switching ON/OFF of the beam separator 107.

Moreover, FIGS. 5A and 5B illustrate a configuration example of the beam separator 107 having a pair of grooves 307A and 307B, and a pair of coils 305A and 305B. However, the number and specific positions of the grooves and the coils depend on specifications required for the apparatus.

Next, the aberration correction by the mirror 108 will be described. FIG. 6 illustrates a detailed configuration of the mirror 108. The mirror 108 includes four electrodes 402 to 405. The electrode 402 is grounded and voltage sources 406 to 408 for applying voltages are respectively connected to the other electrodes 403 to 405. The mirror 108 is irradiated with an electron beam 401 and then the electron beam 401 is substantially perpendicularly reflected by the electric field generated by the four electrodes 402 to 405.

The reflection of the electron beam 401 is performed when an absolute value of the voltage applied to the electrode 405 by the voltage source 408 is a negative potential equal to or greater than the acceleration voltage. For example, in a case where the acceleration voltage is 3 kV, the voltage source 408 applies −3.2 kV to the electrode 405. The electrode 402 is grounded. The system control unit 114 performs correction of the spherical aberration and the chromatic aberration, and control of a focal length of the mirror 108 by the voltage applied to the remaining three electrodes 403 to 405.

Therefore, the spherical aberration and the chromatic aberration are corrected in the high resolution mode and it is possible to sufficiently reduce the beam diameter on the sample 111. Moreover, in a case where the lens barrel is not grounded to accelerate the electron beam and the voltage is applied, the electrode 402 is not grounded and the same voltage is applied.

Next, an example of a mode setting and a sample observation procedure in the example will be described. FIG. 7 illustrates a flowchart of the mode setting and the sample observation. FIGS. 8A and 8B illustrate an example of a mode setting image. Specifically, FIG. 8A illustrates an example of a setting image in a case where the high resolution mode is selected and FIG. 8B illustrates an example of a setting image in a case where the large current mode is selected. The user terminal 115 displays the setting image in a display device and receives an input from a user via an input device.

The user starts the sample observation via the user terminal 115 (S501). The user terminal 115 receiving an instruction of the sample observation start displays a mode setting image on a screen of the display device. When the user refers a saved control parameter, the user terminal 115 reads preset data from the system control unit 114 (S502).

Specifically, in the setting image illustrated in FIGS. 8A and 8B, the user designates the saved control parameter in a setting file selection frame 601. The user terminal 115 instructs the system control unit 114 to transmit designated data. The system control unit 114 transmits the designated data to the user terminal 115. The user terminal 115 displays the received data on the setting image.

Next, the user performs a mode selection of the high resolution mode and the large current mode in a mode selection frame 602 within the setting image (S503). When the user terminal 115 receives a mode selection input by the user, the user terminal 115 informs the selected mode of the system control unit 114.

If a mode is selected, the system control unit 114 turns on an optical element necessary for the selected mode in optical elements not shared in the observation mode of both, and turns off an unnecessary optical element. Specifically, in a case where the high resolution mode is selected (S503: high resolution), the system control unit 114 turns on the beam separator 107 (S504A), turns off the bypass lens 109 (S505A), and turns on the mirror 108 (S506A).

In a case where the large current mode is selected (S503: large current), the system control unit 114 turns off the beam separator 107 (S504B), turns on the bypass lens 109 (S505B), and turns off the mirror 108 (S506B). In any of steps 504A and 504B, in a case where there is an influence of the magnetic history, the system control unit 114 performs the degauss described above before exciting a current to the coils 305A to 305D of the beam separator 107.

After selecting the mode of the observation, the user inputs the setting of the optical condition depending on the mode of the observation into a control parameter frame 603 (S507A and S507B). For example, the adjustment of the beam current of the electron beam 105 described with reference to FIG. 3 is performed by setting numerical values of "condenser lens 1" and "condenser lens 2" of the control parameter frame 603.

When the optical condition is input, the user terminal 115 transmits the numerical values to the system control unit 114. The system control unit 114 measures the beam current and transmits a measured value to the user terminal 115. The user terminal 115 displays the received numerical value on a beam current frame 605 in the mode setting image.

As illustrated in FIG. 8A, in a case where the high resolution mode is selected, the user terminal 115 prohibits the user from writing in a setting field of the optical element which is not used such as the bypass lens 109 or the like in the setting image. Similarly, as illustrated in FIG. 8B, in a case where the large current mode is selected, the user terminal 115 prohibits the user from writing in a setting field of the optical element which is not used such as the mirror 108 or the beam separator 107 in the setting image. Moreover, steps S504 to S507 are in no particular order.

The user saves a parameter value after the determination of the optical condition using a saving frame 604 as necessary (S508). If a saving button is selected, the user terminal 115 transmits a saving instruction together with the parameter value to the system control unit 114. The system control unit 114 saves the parameter value designated to be saved in an internal memory.

After saving the parameter value, the system control unit 114 performs optical axis adjustment (S509) and the sample observation is performed (S510) according to an instruction from the user via the user terminal 115. Images of the optical axis adjustment and the sample observation are omitted. Moreover, it is needless to say that the mode setting image is not limited to the examples illustrated in FIGS. 8A and 8B, and various modifications can be taken.

As described above, according to the example, in the electron beam observation apparatus on which the mirror aberration corrector is mounted, it is possible to realize observation with high resolution and high sensitivity by the high resolution mode, and observation with high efficiency by the large current mode. Furthermore, it is possible to realize switching of the high resolution mode and the large current mode without changing the objective lens optical condition.

Example 2

In Example 1, a case where the electron beam 105 is converged at the entrance 117A and the exit 117C of the beam separator 107 in the high resolution mode is described. However, even if the electron beam 105 is not converged at the entrance 117A and the exit 117C of the beam separator, if the electron beam 105 is converged on a symmetrical plane mapping the entrance 117A to the exit 117C, it is possible to suppress the aberration generated in the beam separator 107.

Therefore, in the example, a configuration, in which the electron beam 105 is not converged at the entrance 117A and the exit 117C of the beam separator 107 and the electron beam 105 is converged on the symmetrical plane in the high resolution mode, will be described. That is, a case where the electron beam 105 becomes a parallel beam or a converged beam when being incident on the beam separator 107 will be described.

An apparatus configuration in the example is the same as the apparatus configuration of Example 1 illustrated in FIG. 1 or 2, and a method for adjusting a beam current of the electron beam 105 or a procedure of executing the observation is also the same as that of Example 1 so that the explanation will be omitted. Here, a trajectory of the electron beam 105 until irradiating the sample 111 passing through the aperture 104 will be described.

FIG. 9 illustrates the trajectory of the electron beam in the high resolution mode and the large current mode of the example. (A) of FIG. 9 illustrates a trajectory of a case where the electron beam 105 is incident on the entrance 117A of the beam separator 107 as the parallel beam in the high resolution mode. (B) of FIG. 9 illustrates a trajectory of the electron beam 105 in the large current mode corresponding to (A) of FIG. 9. The difference from Example 1 is that the electron beam 105 is the parallel beam at the entrance 117A and the exit 117C of the beam separator 107.

As illustrated in (A) of FIG. 9, in the high resolution mode, the electron beam 105 becomes the parallel beam through the second condenser lens 106, is incident on the entrance 117A of the beam separator 107, is deflected by 90 degrees in the beam separator 107, and is emitted from the entrance/exit 117B to the mirror 108. The electron beam 105 is converged at a convergence point 701B when being deflected by 45 degrees in the beam separator 107.

The electron beam 105 passes through the entrance/exit 117B of the beam separator 107, is reflected by the mirror 108, passes through the same trajectory in the opposite direction, and is incident again on the beam separator 107 from the entrance/exit 117B. Moreover, in FIG. 9, description of a detailed trajectory of the electron beam 105 between the beam separator 107 and the mirror 108 will be omitted.

The electron beam 105 is deflected again by 90 degrees by the beam separator 107. At this time, similar to when the convergence point 701B is formed by the first deflection, the electron beam 105 is converged at a convergence point 701C when the electron beam 105 is deflected by 45 degrees. The electron beam 105 passing through the beam separator 107 twice becomes the parallel beam, is emitted from the exit 117C of the beam separator 107, and is converged on the sample 111 through the objective lens 110. The method for acquiring an image thereafter is the same as that of Example 1.

Next, the trajectory in the large current mode will be described with reference to (B) of FIG. 9. In order to perform mode switching without changing an optical condition of the objective lens 110 in the high resolution mode, the system control unit 114 controls the bypass lens 109 so that the electron beam 105 passing through the bypass lens 109 becomes the parallel beam. Therefore, the electron beam 105 passes through the objective lens 110 and is converged on the sample 111 in a state of being the parallel beam. The method for acquiring an image thereafter is the same as that of Example 1.

In addition, similar to Example 1, since the spherical aberration and the chromatic aberration are not corrected in the large current mode, in order to reduce a beam diameter of the electron beam 105 on the sample 111, it is preferable that a beam opening angle on the sample 111 is reduced so that the aberrations are suppressed. The effect of the bypass lens 109 in the large current mode, that is, a method for controlling the beam opening angle of the electron beam 105 on the sample 111 using the bypass lens 109 may be applied to the method described with reference to FIG. 4.

If the position of a convergence point 701E between the second condenser lens 106 and the bypass lens 109 is controlled by the second condenser lens 106, it is possible to control the beam opening angle on the sample 111 without changing the optical conditions of the objective lens 110.

As described above, it is possible to realize the mode switching of the high resolution mode and the large current mode in a case where the electron beam 105 becomes the parallel beam at the entrance 117A of the beam separator 107 without changing the optical conditions of the objective lens 110. Moreover, in a case where the parallel beam is incident on the objective lens 110, an object point of the objective lens 110 can be regarded as infinity.

Next, a case where the electron beam 105 becomes the converged beam at the entrance 117A of the beam separator 107, that is, a case where the electron beam 105 is incident on the entrance 117A of the beam separator 107 while being converged will be described with reference to (C) and (D) of FIG. 9. In this case, the electron beam 105 becomes a divergent beam at the exit 117C of the beam separator 107, that is, becomes a beam emitting from the exit 117C of the beam separator 107 while diverging.

(C) of FIG. 9 illustrates a trajectory in a case where the electron beam 105 is incident on the entrance 117A of the beam separator 107 as the converged beam in the high resolution mode. (D) of FIG. 9 illustrates the trajectory of the electron beam 105 in the large current mode corresponding to (C) of FIG. 9. As illustrated in (C) of FIG. 9, in the high resolution mode, the electron beam 105 passing through the second condenser lens 106 is incident on the beam separator 107, is deflected by 90 degrees in the beam separator 107, and emitted from the entrance/exit 117B in a state of the converged beam.

The electron beam 105 is converged at a convergence point 701G when the electron beam 105 is deflected by 45 degrees in the beam separator 107. The electron beam 105 passes through the entrance/exit 117B of the beam separator 107, is reflected by the mirror 108, passes through the same trajectory in the opposite direction, and is incident again on the beam separator 107 from the entrance/exit 117B. Moreover, the description of the detailed trajectory of the electron beam 105 between the beam separator 107 and the mirror 108 will be omitted.

The electron beam 105 is deflected again by 90 degrees by the beam separator 107. At this time, similar to when the convergence point 701G is formed by the first deflection, the electron beam 105 is converged at a convergence point 701H when the electron beam 105 is deflected by 45 degrees. The electron beam 105 passing through the beam separator 107 twice emits from the beam separator 107 and is converged on the sample 111 passing through the objective lens 110 in a state of a divergent beam.

The trajectory of the divergent beam is extrapolated and a point at which the trajectory gathers is taken as a virtual convergence point 701I. The object point of the objective lens 110 appears as if it is the virtual convergence point 701I. The method for acquiring an image thereafter is the same as that of Example 1.

Next, the trajectory in the large current mode will be described with reference to (D) of FIG. 9. In order to perform mode switching without changing the optical condition of the objective lens 110 in the high resolution mode, the system control unit 114 controls the bypass lens 109 so that the electron beam 105 passing through the bypass lens 109 becomes the divergent beam. The electron beam 105 is a divergent beam passing through the bypass lens 109, passes through the objective lens 110 and then is converged on the sample 111. The method for acquiring an image thereafter is the same as that of Example 1.

A method for switching the high resolution mode and the large current mode without changing the optical conditions of the objective lens 110 will be described with reference to (D) of FIG. 9. The electron beam 105 is converged at a convergence point 701K that is between the virtual convergence point 701I and the bypass lens 109 by the second condenser lens 106. The trajectory of the electron beam in the vicinity of the convergence point 701K is illustrated in an enlarged view (E) in (D) of FIG. 9. The trajectory of the divergent beam passing through the bypass lens 109 is extrapolated and a point at which the trajectory gathers is taken as a virtual convergence point 701L upstream the convergence point 701K.

The object point of the objective lens 110 appears as if it is the virtual convergence point 701L. The bypass lens 109 is controlled so that the object points of the high resolution mode and the large current mode coincide with each other, that is, the virtual convergence point 701L is set at the same position as the virtual convergence point 701I in the high resolution mode of (C) of FIG. 9. Therefore, it is possible to realize switching of the high resolution mode and the large current mode without changing the optical conditions of the objective lens 110.

A method for reducing the beam opening angle of the electron beam 105 on the sample 111 in the large current mode is similar to a case where the electron beam 105 becomes the parallel beam at the entrance 117A of the beam separator 107. Moreover, in the example, the virtual convergence point 701I is positioned upstream the bypass lens 109, but even if virtual convergence point 701I is positioned downstream the bypass lens 109, it is possible to switch the mode with the same method as in the example.

From the description with reference to (C) to (E) of FIG. 9, it is possible to realize the mode switching of the high resolution mode and the large current mode without changing the optical conditions of the objective lens 110 in a case where the electron beam 105 becomes the converged beam at the entrance 117A of the beam separator 107.

According to the example, it is possible to realize switching of the high resolution mode and the large current mode in the electron beam observation apparatus on which the aberration corrector is mounted without changing the optical conditions of the objective lens without setting the convergence points of the electron beam 105 upstream and downstream the beam separator 107.

Example 3

In Example 1, only the optical condition of the objective lens 110 is maintained and the optical conditions of lenses other than that, that is, the first condenser lens 103 and the second condenser lens 106 are changed when performing switching of the high resolution mode and the large current mode. On the other hand, in the example, when switching the mode, a configuration, in which the optical conditions of all lenses other than the bypass lens 109, that is, the first condenser lens 103, the second condenser lens 106, and the objective lens 110 are maintained, and only the optical condition of the bypass lens 109 is changed, will be described.

Therefore, for example, it is possible to perform the adjustment of the optical axis of the electron beam 105 other than the mirror aberration corrector in the high resolution mode under a condition that the beam separator 107 is turned off. The mode is called non-correction mode.

An apparatus configuration in the example is the same as the apparatus configuration of Example 1 illustrated in FIG. 1 or 2, and a method for adjusting a beam current of the electron beam 105 or a procedure of executing the observation is also the same as that of Example 1 so that the explanation will be omitted. In addition, in the example, since the trajectory of the electron beam 105 of the high resolution mode is the same as that illustrated in FIG. 1, here, the description will be omitted and a trajectory of the electron beam 105 of the non-correction mode will be described in detail.

FIG. 10 illustrates a trajectory of the electron beam 105 from the aperture 104 to the sample 111 in the non-correction mode of the example. As illustrated in FIG. 1, in the high resolution mode, the convergence point 116B is formed at the entrance 117A and the convergence point 116E is formed at the exit 117C of the beam separator 107. Therefore, in order to switch the observation mode to the non-correction mode of all lenses other than the bypass lens 109 without changing the optical conditions, the electron beam observation apparatus may project the convergence point 116B at the convergence point 116E using the bypass lens 109.

That is, as illustrated in FIG. 10, in the non-correction mode, the bypass lens 109 projects the convergence point at the entrance 117A of the beam separator 107 to the exit 117C of the electron beam 105. Particularly, in the example, as illustrated in FIG. 10, the beam separator 107 has a structure in which an upper half and a lower half are symmetrical with respect to the bypass lens 109. In this case, since a distance from the bypass lens 109 to the convergence point 116B is equal to a distance from the bypass lens 109 to the convergence point 116E, the convergence point 116B is projected to the convergence point 116E at the same magnification.

Since the bypass lens 109 projects the convergence point 116B to the convergence point 116E at the same magnification, there is an advantage that the opening angle of the electron beam 105 on the sample 111 does not change when switching the mode.

The trajectory of the electron beam in the non-correction mode of the example will be described with reference to FIG. 10. The electron beam 105 passes through the aperture 104, passes through the second condenser lens 106, and is converged at a convergence point 801B at the entrance 117A of the beam separator 107. The system control unit 114 sets the convergence point 801B at the same position as the convergence point 116B at the entrance 117A of the beam separator 107 in the high resolution mode.

The electron beam 105 incident on the beam separator 107 passes through the bypass lens 109 and is converged at a convergence point 801C at the exit 117C of the beam separator 107. The system control unit 114 controls the bypass lens 109 so that the convergence point 801C is at the same position as the convergence point 116E at the exit 117C of the beam separator 107 in the high resolution mode. In this case, the magnification of the bypass lens 109 is the same magnification. The electron beam 105 emitted from the exit 117C of the beam separator 107 passes through the objective lens 110 and is converged on the sample 111. The method for acquiring an image thereafter is the same as that of Example 1 so that the description will be omitted.

In the electron beam observation apparatus on which the mirror aberration corrector is mounted, it is possible to realize switching of the high resolution mode and the non-correction mode by the example without changing the optical conditions of all lenses other than the bypass lens 109.

Example 4

In Examples 1 to 3, a main object is to acquire the information of the surface of the sample. The acceleration voltage of the electron beam 105 is, for example, substantially 3 kV. On the other hand, if the acceleration voltage is high, information on an inner surface of the sample 111 can be observed. Therefore, in the example, a high acceleration mode of a case where the acceleration voltage is high will be described.

In the high acceleration mode, the system control unit 114 does not operate the mirror aberration corrector. The reason will be described. As an example, in the apparatus configuration illustrated in FIG. 1, it is assumed that the acceleration voltage is 30 kV. In order to deflect the electron beam 105 in the beam separator 107, an excitation current flowing through a coil 305 needs to be 3.2 times an example in which the acceleration voltage is 3 kV. Furthermore, a voltage required for the electrode 405 of the mirror 108 needs to be 30 kV or more.

In terms of mounting, it is difficult to realize the conditions described above in the apparatus designed for 3 kV and a size of the optical element has to be increased. In addition, since the diffraction aberration becomes small in a case where the acceleration voltage is high, it is possible to reduce the opening angle of the electron beam 105 on the sample 111. Therefore, a spot diameter of the electron beam 105 on the sample 111 is not affected by the spherical aberration and the chromatic aberration, and the aberration correction by the aberration corrector is not required.

From the two points described above, in a case where the acceleration voltage is high, it is preferable that the mirror aberration corrector is not operated. In the high acceleration mode in the example, the electron beam 105 is high acceleration and the mirror aberration corrector is not operated.

The apparatus configuration in the example is similar to the apparatus configuration of Example 1 illustrated in FIG. 1 or 2, and a method for adjusting the beam current of the electron beam 105 or a procedure of executing the observation is also similar to that of Example 1, so that the description will be omitted. In the high acceleration mode, the system control unit 114 applies a voltage (acceleration voltage) of substantially 30 kV in the electron source 101.

In the electron beam observation apparatus of the example, it is also possible to realize the trajectory of the electron beam of any of the large current mode of FIGS. 2 and 9, and the non-correction mode of FIG. 10. The system control unit 114 controls the optical element so as to form the trajectories. The method for acquiring an image after irradiating the sample 111 with the electron beam 105 is the same as that of Example 1 so that the description will be omitted.

It is possible to realize the high resolution mode and the high acceleration mode in the electron beam observation apparatus on which the mirror aberration corrector is mounted by the example.

Moreover, the invention is not limited to the examples described above and includes various modification examples. For example, the examples described above are described in detail in order to explain the invention in an easy-to-understand manner, and are not necessarily limited to those having all the configurations described. In addition, it is possible to replace a part of the configuration of one example with the configuration of another example, and the configuration of another example can be added to the configuration of one example. Further, it is possible to add, delete, and replace other configurations with respect to a part of the configuration of each example.

In addition, each of the configurations, functions, processing units, and the like described above may be realized by hardware, for example, by designing a part or all of them with, for example, an integrated circuit. In addition, each of the configurations, functions, and the like described above may be realized by software by interpreting and executing a program with which the processor realizes each function. Information such as a program, a table, a file, or the like realizing each function can be placed in a memory, a recording device such as a hard disk and a Solid State Drive (SSD), or a recording medium such as an IC card or an SD card. In addition, control lines and information lines indicate what is considered to be necessary for explanation, and not necessarily all control lines and information lines are necessarily indicated on a product. In fact, it may be considered that almost all the structures are mutually connected.

The invention claimed is:

1. A charged particle beam application apparatus which irradiates a sample with a charged particle beam generated from a charged particle beam source, the apparatus comprising:
    a charged particle beam source;
    an aberration corrector that is disposed downstream the charged particle beam source;
    an objective lens that is disposed downstream the aberration corrector; and
    a control unit that controls the aberration corrector,
    wherein the aberration corrector includes
    a mirror that corrects aberration of the charged particle beam from the charged particle beam source,
    a beam separator that includes an entrance on which the charged particle beam from the charged particle beam source is incident and an exit from which the charged particle beam is emitted to the objective lens, and separates an incident trajectory on the mirror from the entrance and a reflection trajectory from the mirror to the exit from each other by deflecting the charged particle beam in an ON state, and
    a bypass optical system that is disposed at a position at which the trajectory of the charged particle beam bypasses when the beam separator is in the ON state and the trajectory of the charged particle beam passes through when the beam separator is in an OFF state within the beam separator, and
    wherein the bypass optical system controls the charged particle beam so that objective lens optical conditions at the trajectory via the mirror and the trajectory passing through the bypass optical system coincide with each other.

2. The charged particle beam application apparatus according to claim 1,
    wherein the bypass optical system projects a convergence point of the charged particle beams formed on an upstream side to a downstream side, and
    wherein the projected convergence point and a convergence point in the reflection trajectory coincide with each other.

3. The charged particle beam application apparatus according to claim 2,
    wherein a magnification at which the bypass optical system projects the convergence point downstream the beam separator is same magnification.

4. The charged particle beam application apparatus according to claim 1,
    wherein the bypass optical system is disposed at a position including a midpoint between the entrance and the exit.

5. The charged particle beam application apparatus according to claim 1,
    wherein a large current mode and a small current mode of the charged particle beam are provided, and
    wherein the control unit sets the beam separator and the mirror to be in the ON state in the small current mode, and sets the beam separator to be in the OFF state and the bypass optical system to be in the ON state in the large current mode.

6. The charged particle beam application apparatus according to claim 1,
    wherein a high acceleration mode and a low acceleration mode of the charged particle beam are provided, and
    wherein the control unit sets the beam separator and the mirror to be in the ON state in the low acceleration mode, and sets the beam separator to be in the OFF state and the bypass optical system to be in the ON state in the high acceleration mode.

7. The charged particle beam application apparatus according to claim 1,
    wherein a first mode and a second mode are provided, and
    wherein the control unit
    sets the beam separator and the mirror to be in the ON state, and the bypass optical system to be in the OFF state in the first mode, and
    sets the beam separator and the mirror to be in the OFF state, and the bypass optical system to be in the ON state in the second mode.

8. The charged particle beam application apparatus according to claim 7, further comprising:
    a lens on the upstream side of the aberration corrector,
    wherein the control unit controls the lens and the bypass optical system so that an opening angle in the second mode is smaller than an opening angle on the sample in the first mode.

9. The charged particle beam application apparatus according to claim 7,
    wherein the coincidence of the objective lens optical conditions means that object points of the objective lens in the trajectory via the mirror and the trajectory passing through the bypass optical system coincide with each other, or magnifications of acquired images coincide with each other.

10. The charged particle beam application apparatus according to claim 1,
    wherein the objective lens optical condition is a driving voltage or current of an optical element downstream the beam separator.

11. The charged particle beam application apparatus according to claim 10,
    wherein the objective lens optical condition is at least one of a retarding voltage, a boosting voltage, or an excitation current of the objective lens.

12. An aberration corrector which is used in a charged particle beam application apparatus irradiating a sample with a charged particle beam generated from a charged particle beam source, the corrector comprising:

a mirror that corrects aberration of the charged particle beam from the charged particle beam source;

a beam separator that includes an entrance on which the charged particle beam from the charged particle beam source is incident and an exit from which the charged particle beam is emitted to an objective lens, and separates an incident trajectory on the mirror from the entrance and a reflection trajectory from the mirror to the exit from each other by deflecting the charged particle beam in an ON state; and a bypass optical system that is disposed at a position at which the trajectory of the charged particle beam bypasses when the beam separator is in the ON state and the trajectory of the charged particle beam passes through when the beam separator is in an OFF state within the beam separator, wherein the bypass optical system controls the charged particle beam so that objective lens optical conditions at the trajectory via the mirror and the trajectory passing through the bypass optical system coincide with each other.

* * * * *